United States Patent [19]
Fujihara et al.

[11] Patent Number: 5,227,015
[45] Date of Patent: Jul. 13, 1993

[54] METHOD OF FABRICATING SEMICONDUCTOR LASER

[75] Inventors: Kiyoshi Fujihara; Masato Ishino; Naoki Takenaka, all of Osaka, Japan

[73] Assignee: Matsushita Electric Industrial Co., Ltd., Osaka, Japan

[21] Appl. No.: 735,728

[22] Filed: Jul. 25, 1991

[30] Foreign Application Priority Data

Jul. 30, 1990 [JP] Japan .................................. 2-202098

[51] Int. Cl.$^5$ ........................................ H01L 21/306
[52] U.S. Cl. .................................... 156/647; 437/129; 148/DIG. 95; 156/625
[58] Field of Search ............... 437/129; 148/DIG. 95; 156/647, DIG. 80, 625

[56] References Cited

U.S. PATENT DOCUMENTS

| | | |
|---|---|---|
| 4,984,244 | 1/1991 | Yamamoto et al. ............... 437/129 |
| 4,994,142 | 2/1991 | Appelbaum ........................ 156/647 |
| 5,019,519 | 5/1991 | Tanaka et al. ..................... 437/129 |
| 5,075,239 | 12/1991 | Tegude ............................... 437/129 |
| 5,093,278 | 3/1992 | Kamei ................................ 437/129 |

OTHER PUBLICATIONS

"Technical Research Report" OQE85-8, pp. 55-58 (1985).

*Primary Examiner*—Brian E. Hearn
*Assistant Examiner*—Kevin M. Picardat
*Attorney, Agent, or Firm*—Lowe, Price, LeBlanc & Becker

[57] ABSTRACT

An n-InP buffer layer 102, an InGaAsP active layer 103, a p-InP cladding layer 104 and a p-InGaAsP surface protective layer 105 are successively epitaxially grown on an n-InP substrate 101 having a (100) plane as a main plane. An etching mask 106, an insulating film, is formed in a stripe in the <011> direction by photolithography and dry etching. Using a solution comprising a mixture of hydrochloric acid, oxygenated water and acetic acid, the n-InP buffer layer 102 is etched to a depth lower than the p-InP cladding layer 103, to form a mesa stripe 107. Next, the insulating film 106 is removed and the p-InGaAsP surface protective layer 105 is removed using a solution comprising a mixture of sulfuric acid and oxygenated water. Thereafter, InP current blocking layers 108 and 109 are selectively formed at the regions other than the mesa stripe 107 by the liquid-phase epitaxial growth. Thus, a buried heterostructure semiconductor laser is fabricated, having good laser characteristics and a high reliability.

6 Claims, 8 Drawing Sheets

METHOD OF FABRICATING SEMICONDUCTOR LASER

BACKGROUND OF THE INVENTION

1. Field of the Invention

This invention relates to a method of fabricating a buried heterostructure semiconductor laser important as a light source for optical-fiber communications.

2. Description of the Prior Art

As structures of semiconductor lasers, widely used are buried heterostructures comprising an active layer which is surroundingly covered with semiconductor materials having a large energy gap and a small refractive index. Semiconductor lasers with this buried heterostructure have superior characteristics such that the they have a low oscillatory threshold current value and a stable oscillation transverse mode, and hence have attracted notice as light sources for optical-fiber communications.

A conventional method for their fabrication is exemplified by the method disclosed in DENSHI JOHO TSUSHIN GAKKAI (Electronic Information Communication Society), Technical Research Report OQE85-8, p.55. This conventional fabrication method is shown in FIGS. 7A to 7E.

As shown in FIG. 7A, first, on an n-InP substrate 101 having a (100) plane as a main plane, an n-InGaAsP light guide layer 501, an InGaAsP active layer 103, a p-InGaAsP buffer layer 502 and a p-InP cladding layer 503 with a thickness of about 1.5 μm are successively epitaxially grown. Thereafter, a mask pattern in a stripe is formed on the p-InP cladding layer in the <011> direction to give an insulating film 504 comprising $SiO_2$ or $Si_3N_4$ (FIG. 7B). Next, after selective etching of the p-InP cladding layer 503 by the use of a solution comprising a mixture of hydrochloric acid and phosphoric acid (FIG. 7C), etching is further carried out using a Br-methanol solution, an etchant for InP and InGaAsP, to form a mesa stripe 505 (FIG. 7D). Finally, after removal of the insulating film 504, a p-InP current blocking layer 108 and an n-InP current blocking layer 109 are formed by a liquid-phase epitaxial growth process in such a way that they are not laid on the cladding layer 503 of the mesa stripe 505. A p-InP burying layer 110 and a p-InGaAsP contact layer 111 are further grown thereon to form a buried heterostructure (FIG. 7E).

However, as a problem in the method of fabricating the above structure, there is the problem that the etching may proceed at a greatly irregular rate to make it difficult to control the width of the stripe of the InGaAsP active layer 103 because the Br (bromine) tends to be evaporated in the etching carried out using the Br-methanol solution to cause the solution to undergo great changes with time.

In addition, the stripe comes to have an inverted mesa form when the etching is carried out using the Br-methanol solution. Here, making thin the p-InP cladding layer 503 is effective from the standpoints of, e.g., decreasing the voltage applied to the above n-InP current blocking layer 109 formed when epitaxial growth for burying is effected, restraining the thyristor operation or output saturation at the time of high-output operation, and also improving temperature characteristics. In usual instances, the mesa stripe 505 is required to have a height large enough for its both sides to be held with the current blocking layers 108 and 109, and hence the etching must be carried out until it has such a height.

When, however, the cladding layer 503 is formed in a small thickness of about 1 μm, the InGaAsP active layer 103 comes to be positioned above a constricted part as shown in FIG. 8, so that a (111)A plane 601 tending to form an interfacial level at the sides of the active layer during the crystal growth is exposed. As a result, laser characteristics may become poor as exemplified by an increase in the threshold current values. Our experiments have confirmed this fact.

Besides the Br-methanol solution used here in the etching, a solution comprising a mixture of oxygenated water and hydrochloric acid is also known as an etchant for InP and InGaAsP. When, however, a wafer comprising the p-InP cladding layer 503 on which a mask comprising a stripe-like insulating film has been formed in the <011> direction as in the case of the conventional method is etched with this etchant, the stripe comes to have an inverted mesa form as in the etching with the Br-methanol solution. It is hence impossible to obtain good laser characteristics.

Accordingly, it is necessary to take a method by which the mesa stripe does not come to have an inverted mesa form. As a method that may cause no exposure of (111)A plane 601, there is a method in which a negative resist mask is used. As shown in FIG. 9, since a resist has a poorer adhesion to a semiconductor after than an insulating layer, side etching occurs beneath a resist mask 701 and hence a mesa stripe 700 becomes narrower in the width direction than the resist mask 701. The etching proceeds to generally give a regular mesa form and therefore the (111)A plane 601 tending to form the interfacial level is not exposed. This is a preferable result. Since, however, the resist mask 701 and the p-InP cladding layer 503 are not adhered to each other in a stable state, the form of the mesa stripe 700 formed by etching may change to make the control of stripe width unstable.

According to the conventional epitaxial growth for burying, the uppermost layer of the mesa stripe is the p-InP cladding layer 503, and hence the p-InP cladding layer 503 is directly uncovered when soaked before the current blocking layers are grown. This causes dissociation of P (phosphorus) atoms having a high vapor pressure, and any defects resulting therefrom reach not only the p-InP cladding layer 503 but also the interface between the InGaAsP active layer 103 and the p-InP cladding layer 503 in the case when the p-InP cladding layer 503 has a small thickness, where there is a possibility of lowering the emission efficiency of a laser or adversely affecting its reliability.

As discussed above, there are the problems that, when the etching is carried out using the Br-methanol solution or the solution comprising a mixture of oxygenated water and hydrochloric acid, the stripe comes to have an inverted mesa form, making it difficult to control the stripe width, and, when the p-InP cladding layer is made thin, the (111)A plane 601 is exposed to bring about poor laser characteristics.

In the conventional fabrication method, there is another problem that the p-InP cladding layer can not be made thin so much because the direct exposure of the p-InP cladding layer 503 when the layer is soaked before the current blocking layers are grown by the epitaxial growth for burying, brings about defects in the p-InP cladding layer to cause poor laser characteristics and reliability.

SUMMARY OF THE INVENTION

In order to fabricate a buried heterostructure semiconductor laser having good laser characteristics and a high reliability, objects of the present invention are to improve the controllability of stripe width of the mesa stripe in the course of etching, to obtain a mesa stripe wherein no (111)A plane is exposed at the sides of the active layer, and to cause no defects in the p-InP cladding layer during the epitaxial growth for burying.

To solve the problems previously discussed, the present invention provides a method of fabricating a semiconductor laser by a process comprising the steps of;

forming on a first-conductivity type InP substrate having a (100) plane as a main plane, a semiconductor multi-layer structure comprising an InGaAsP active layer, a second-conductivity type InP cladding layer and as an uppermost layer an InGaAsP surface protective layer;

forming on said surface protective layer an insulating film mask in a stripe in the <011> direction;

removing said InGaAsP surface protective layer, said second-conductivity type InP cladding layer and said InGaAsP active layer at their regions adjoining to both sides of said mask formed in a stripe, by etching with a solution comprising a mixture of hydrochloric acid and oxygenated water using said insulating film mask as a mask, to form a mesa stripe; and laminating current blocking layers on both sides of said mesa stripe by epitaxial growth for burying.

As another embodiment, the present invention also provides a method of fabricating a semiconductor laser by a process comprising the steps of;

forming on a first-conductivity type InP substrate having a (100) plane as a main plane, a diffraction grating that defines oscillation wavelengths;

epitaxially growing a first-conductivity type InGaAsP wave guide layer, an InGaAsP active layer, a second conductivity type InP cladding layer and a second-conductivity type InGaAsP surface protective layer successively on said diffraction grating;

forming on said surface protective layer an insulating film in a stripe as an etching mask;

etching said layers by the use of a solution comprising a mixture of hydrochloric acid and oxygenated water using said insulating film as a mask, and subsequently etching a semiconductor layer at its regions adjoining to both sides of said mask formed in a stripe, by the use of a solution comprising a mixture of hydrochloric acid and phosphoric acid, to form a mesa stripe; and forming current blocking layers on both sides of said mesa stripe by liquid-phase epitaxial growth.

As described above, in the etching carried out using the solution comprising a mixture of hydrochloric acid and oxygenated water after an etching insulating film mask has been formed on the InGaAsP surface protective layer, the stripe comes to have a regular mesa form because of the surface protective layer. Hence, the (111)A plane is not exposed and the laser characteristics can not become poor. The controllability of stripe width can also be improved because the etchant may undergo a smaller change with time than the Br-methanol solution.

In the present invention, the liquid-phase epitaxial growth is effected in the state that the InGaAsP surface protective layer is provided, even when the p-InP cladding layer has been made thin. Hence, the surface of the p-InP cladding layer is not uncovered and the P atoms having a high vapor pressure do not come to be dissociated, so that it becomes possible to prevent defects from occurring in the p-InP cladding layer and to obtain a semiconductor laser having good characteristics.

DESCRIPTION OF THE PREFERRED EMBODIMENTS

Figure 1A:
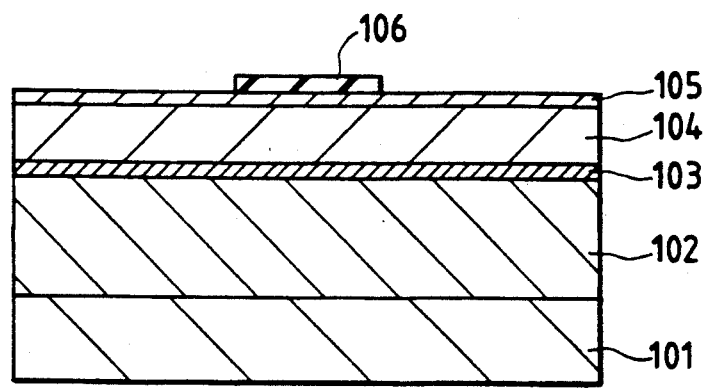
FIGS. 1A to 1C cross-sectionally illustrate a fabrication process for a semiconductor laser according to the present invention.
Figure 1B:
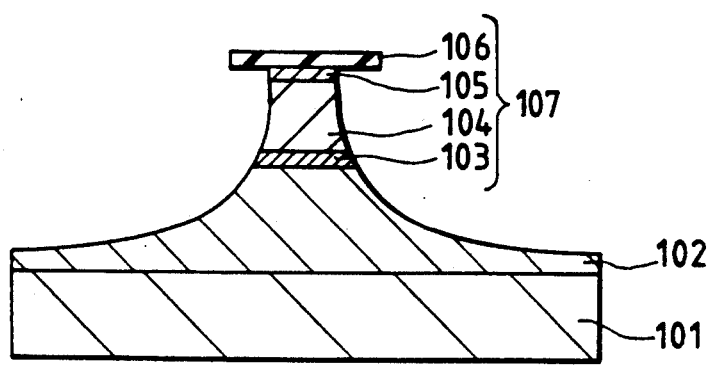
Figure 1C:
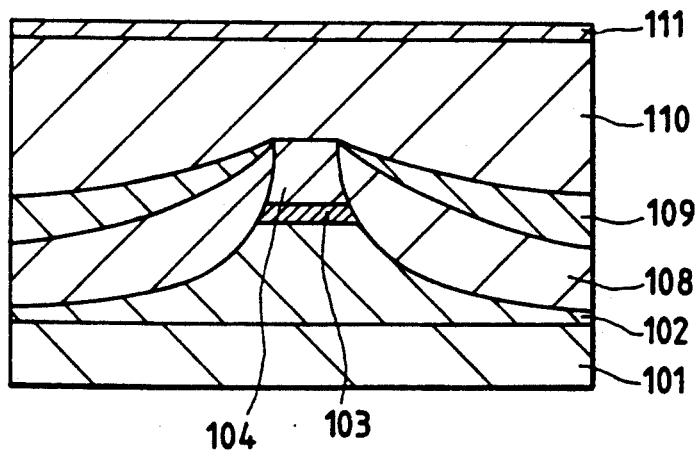

FIGS. 1A to 1C illustrate a first embodiment of the present invention. First, as shown in FIG. 1A, on an n-InP substrate 101 having a (100) plane as a main plane, an n-InP buffer layer 102 with a thickness of 5 $\mu$m, an InGaAsP active layer 103 with a thickness of 0.2 $\mu$m, a p-InP cladding layer 104 with a thickness of not less than 1.0 $\mu$m and a p-InGaAsP surface protective layer 105 with a thickness of 0.2 $\mu$m are successively formed by the liquid-phase epitaxial growth process to give a semiconductor wafer of a multi-layer structure. On the resulting semiconductor wafer, an insulating film comprising $SiO_2$ or $Si_3N_4$ is deposited by photo-CVD (or plasma CVD). Thereafter, an etching mask 106 is formed in a stripe with a width of 8 $\mu$m in parallel to the <011> direction by photolithography and dry etching. Using a solution comprising a mixture of hydrochloric acid, oxygenated water and acetic acid (volume ratio: 3:1:36), the n-InP buffer layer 102 is etched to a depth of 2 $\mu$m beneath the InGaAsP active layer 103 to form a mesa stripe 107 (FIG. 1B). This etchant makes it possible to obtain the mesa stripe in the form of a regular mesa, when etching is carried out using the insulating film mask formed in a stripe in the <011> direction like the conventional method, in the InP multi-layer structure formed on the (100) InP substrate, provided on its uppermost surface with the InGaAsP layer. Hence, the (111)A plane 601 is not exposed at the sides of the mesa stripe. In this instance, the uppermost layer of the mesa stripe has a width of about 1.5 $\mu$m.

Next, the insulating film 106 is removed using a hydrofluoric acid solution, and then the p-InGaAsP surface protective layer 105 is removed using a solution comprising a mixture of sulfuric acid and oxygenated water. Thereafter, a p-InP current blocking layer 108 and n-InP current blocking layer 109 are selectively formed by liquid-phase epitaxial growth on both sides of the mesa stripe 107 in such a way that they are not grown on the p-InP cladding layer 104 of the mesa stripe 107. Thereafter, a p-InP burying layer 110 and a p-InGaAsP contact layer 111 are further successively grown thereon to form a buried heterostructure (FIG. 1C). In general, in the liquid-phase epitaxial growth, the n-InP current blocking layer 109 is not overlaid on the mesa stripe 107 when the mesa stripe 107 has a height of about 2 $\mu$m or more and the stripe has a width of about 5 $\mu$m or less. Thus, good current blocking layers can be formed on both sides of the mesa stripe 107, and electric currents can be effectively injected to the active layer. In this method, since the stripe mask is an insulating film, the adhesion of the p-InGaAsP surface protective layer 105 to the insulating film mask 106 can be in so good a state that the regular mesa form can be stably obtained and no (111)A plane 601 is exposed at the side of the InGaAsP active layer 103.

In the present first embodiment, the mesa stripe 107 is formed using as an etchant for InP the solution comprising a mixture of hydrochloric acid, oxygenated water and acetic acid (volume ratio: 3:1:36). The reason why nevertheless the mesa stripe is not formed in the inverted mesa that is formed in the conventional method is that the surface protective layer 105 is formed on the p-InP cladding layer 104. Because of the presence of this protective layer, the mesa stripe comes to have the regular mesa structure advantageous for the buried heterostructure lasers, even when the etching is carried out using the solution comprising a mixture of hydrochloric acid, oxygenated water and acetic acid.

Figure 2A:
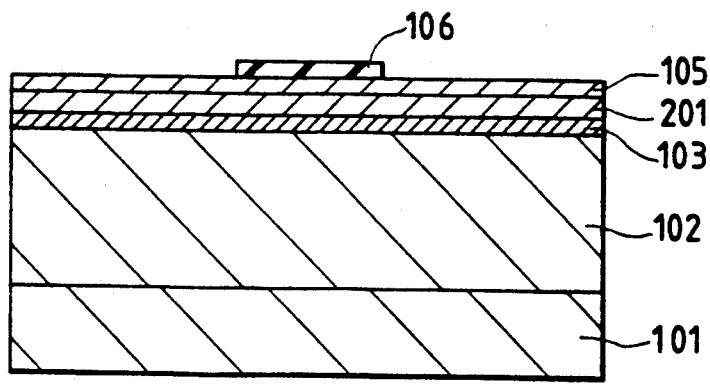
FIGS. 2A to 2C cross-sectionally illustrate another fabrication process for a semiconductor laser according to the present invention.
Figure 2B:
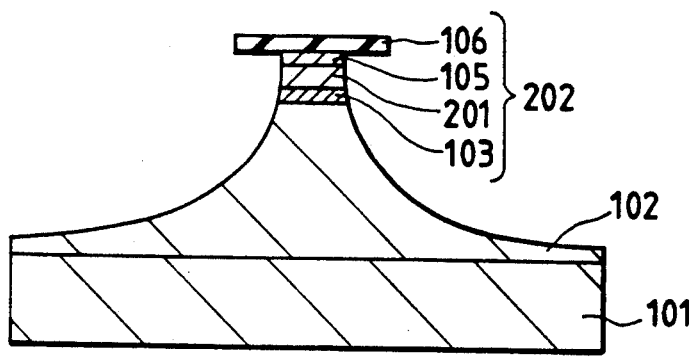
Figure 2C:
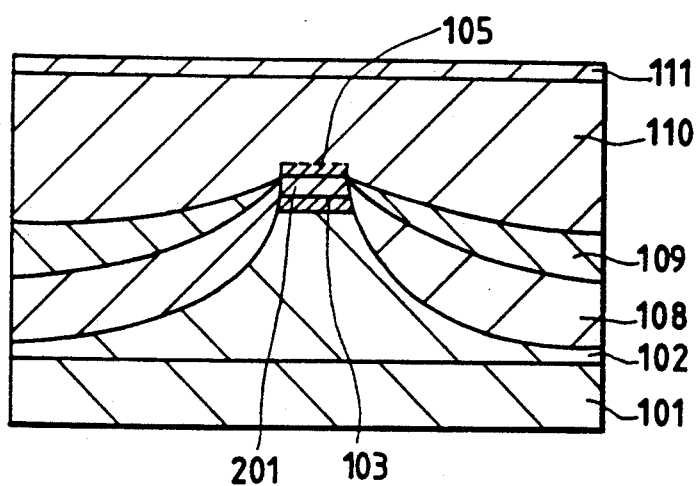
Figure 3A:
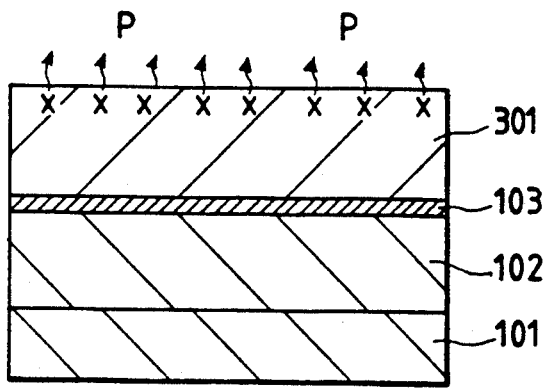
FIGS. 3A to 3C cross-sectionally illustrate a difference between the embodiment shown in FIGS. 1A to 1C and the embodiment shown in FIGS. 2A to 2C.
Figure 3B:
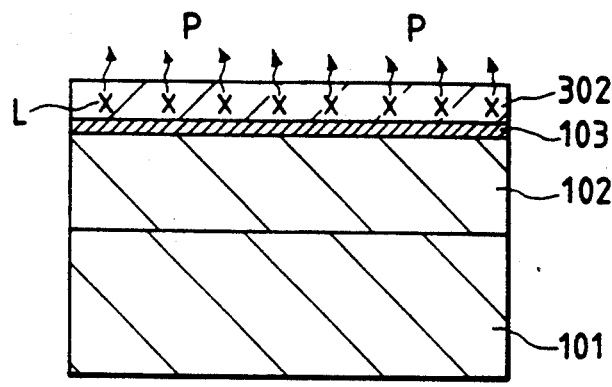
Figure 3C:
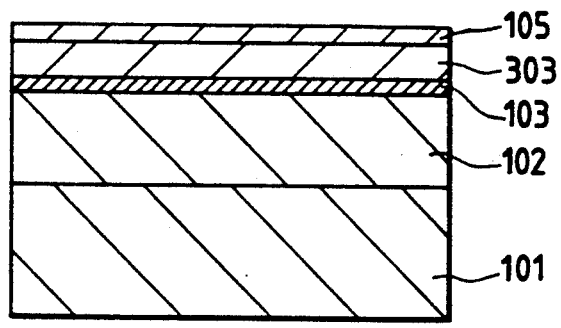

FIGS. 2A to 2C illustrate a second embodiment of the present invention. In FIG. 2A, in the same way as in the first embodiment, on a semiconductor wafer with a semiconductor multi-layer structure, an insulating film comprising SiO$_2$ or Si$_3$N$_4$ is deposited by photo-CVD (or plasma CVD). Thereafter, an etching mask 106 is formed in a stripe with a width of 8 $\mu$m in parallel to the <011> direction by photolithography and dry etching. What is different from the first embodiment is that the p-InP cladding layer 201 is in a layer thickness of as small as about 0.3 $\mu$m. The reason therefor is, as previously stated, that making thin the p-InP cladding layer on the active layer is effective from the standpoints of, e.g., decreasing the voltage applied to the above n-InP current blocking layer 109 formed when the epitaxial growth for burying is effected, restraining the thyristor operation or output saturation at the time of high-output operation, and also improving temperature characteristics. Then, using a solution comprising a mixture of hydrochloric acid, oxygenated water and acetic acid, the n-InP buffer layer 102 is etched to a depth of about 3 $\mu$m beneath the InGaAsP active layer 103 so that the mesa stripe can be in a given height. A mesa stripe 202 is thus formed (FIG. 2B) After removal of the insulating film mask 106, a p-InP current blocking layer 108, an n-InP current blocking layer 109, a p-InP burying layer 110 and a p-InGaAsP contact layer 111 are successively grown by the liquid-phase epitaxial growth to form a buried heterostructure (FIG. 2C). What are different from the first embodiment are that the p-InP cladding layer 201 has so small a thickness that the active layer 103 is located closely beneath the burying layer 110, interposing the p-InP cladding layer 201 between them, and the current blocking layer 108 is formed by the burying epitaxial growth in the state that the p-InGaAsP surface protective layer 105 remain unremoved. Here, in the first embodiment there is no problem because a p-InP cladding layer 301 is thick as shown in FIG. 3A. When, however, a p-InP cladding layer 302 has a thickness smaller than 0.5 $\mu$m as shown in FIG. 3B, the defects L resulting from the dissociation of the P atoms having a high vapor pressure, caused in the p-InP cladding layer 302 when soaked before the current blocking layers are grown, adversely affect even the InGaAsP active layer 103 to give a possibility of making laser characteristics poor, e.g., lowering the emission efficiency of a laser. In the present second embodiment, however, as shown in FIG. 3C the p-InGaAsP surface protective layer 105 is formed and the epitaxial growth for burying is effected in the state the protective layer remains unremoved. Hence, no defects occurs in the p-InP cladding layer 303 when it is soaked. This is due to the fact that the p-InP cladding layer 303 is protected by the thermally tough p-InGaAsP layer.

The p-InGaAsP surface protective layer 105 is automatically melted back to a liquid phase when the p-InP current blocking layer 108 is grown, and hence does not remain in the structure after the epitaxial growth for burying has been completed. This is because the InP layer does not grown on the narrow-width mesa stripe as a characteristic feature of the liquid-phase epitaxial growth and hence the InGaAsP layer that can be readily melted back is selectively removed. In the structure thus fabricated, the p-InP cladding layer 201 is so thin that the p-InP cladding layer 201 itself has a small series resistance and also the voltage applied to the p-InP cladding layer can be small. Hence, the thyristor operation or output saturation at the time of high-output operation can be restrained and also temperature characteristics can be improved, so that good laser characteristics can be obtained.

Figure 4A:
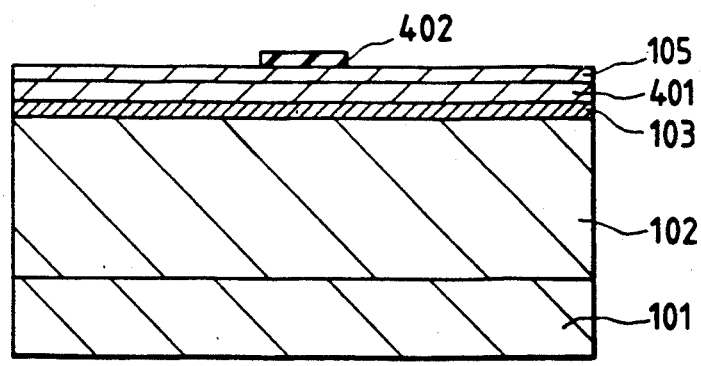
FIGS. 4A to 4D cross-sectionally illustrate still another fabrication process for a semiconductor laser according to the present invention.
Figure 4B:
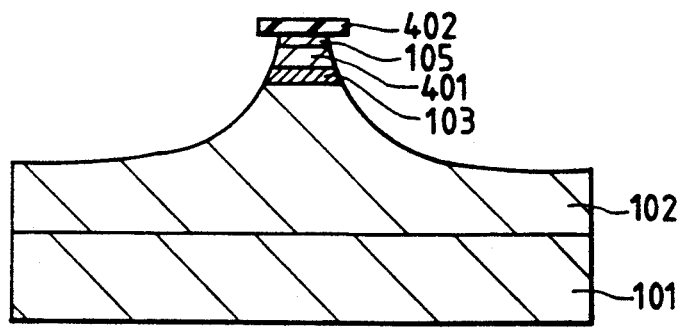
Figure 4C:
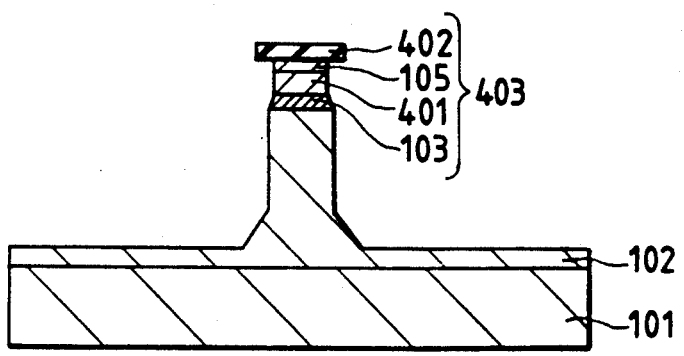
Figure 4D:
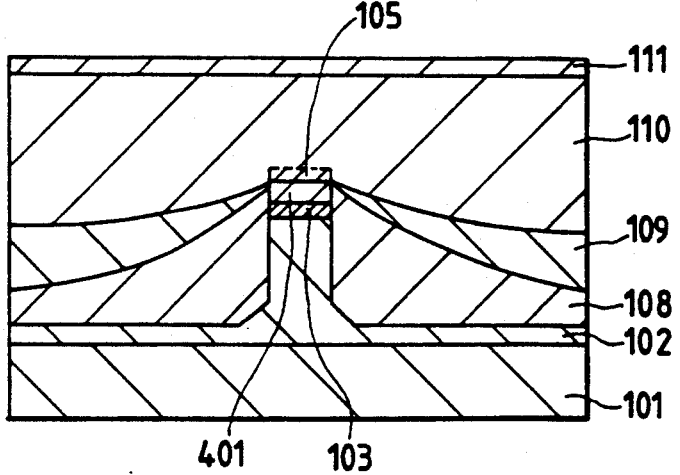

FIGS. 4A to 4C illustrate a third embodiment of the present invention. As shown in FIG. 4A, on the same semiconductor wafer with a multi-layer structure as in the second embodiment, an insulating film comprising SiO$_2$ or Si$_3$N$_4$ is deposited by photo-CVD (or plasma CVD). Thereafter, an etching mask 402 is formed in a stripe with a width of 4 $\mu$m in parallel to the <011> direction by photolithography and dry etching. Then, using a solution comprising a mixture of hydrochloric acid, oxygenated water and acetic acid, the n-InP buffer layer 102 is etched to a depth of about 1 $\mu$m beneath the InGaAsP active layer 103 to completely remove the InGaAsP active layer 103 except for its region corresponding to the mesa stripe (FIG. 4B). Next, using a solution comprising a mixture of hydrochloric acid and phosphoric acid (volume ratio: 1:2), the n-InP buffer layer 102 is etched in substantially the vertical direction to a depth of about 2 $\mu$m (FIG. 4C). The liquid-phase epitaxial growth is effected in the same way as in the second embodiment to form a buried heterostructure (FIG. 4D). In the present embodiment, the solution comprising a mixture of hydrochloric acid and oxygenated water is used only for mainly removing the InGaAsP active layer 103 and the solution comprising a mixture of hydrochloric acid and phosphoric acid that may not cause side-etching is used for etching the n-InP buffer layer 102. The solution comprising a mixture of hydrochloric acid and phosphoric acid has the properties that it does not etch the InGaAsP layer and etches only the InP layer. Hence, when the p-InP cladding layer has a small thickness, the layers reaching the active layer are first etched with the solution comprising a mixture of hydrochloric acid, oxygenated water and acetic acid, and thereafter the depth necessary for the formation of the current blocking layers can be controlled using the solution comprising a mixture of hydrochloric acid and phosphoric acid. Thus, the etching method used in the third embodiment enables better control of the stripe width than the first and second embodiments. With regard to the non-uniformity of the active layer width in the wafer, it can achieve a 30% decrease compared with the fabrication method making use of the conventional Br-methanol solution, so that a laser device with stable characteristics can be obtained.

FIGS. 5A to 5D illustrate an example for a process for fabricating a buried heterostructure of a DFB (distributed feedback) laser used in optical-fiber communications. The present invention can be applied to the fabrication of the DFB laser. A method for its fabrication will be described with reference to the drawings.

Figure 5A:
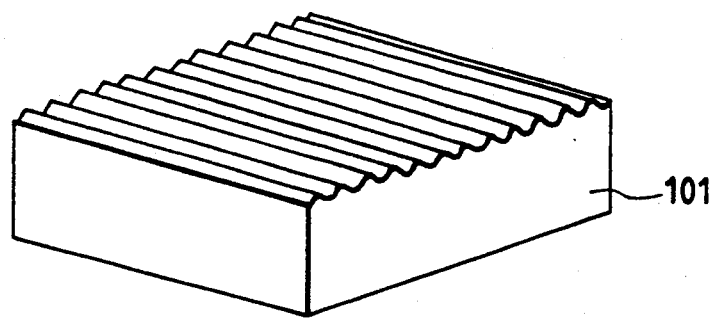
FIGS. 5A to 5D cross-sectionally illustrate a fabrication process for a DFB laser according to the present invention.
Figure 5B:
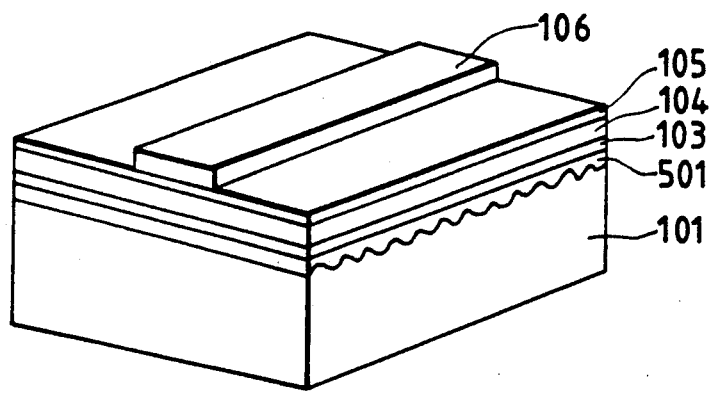
Figure 5C:
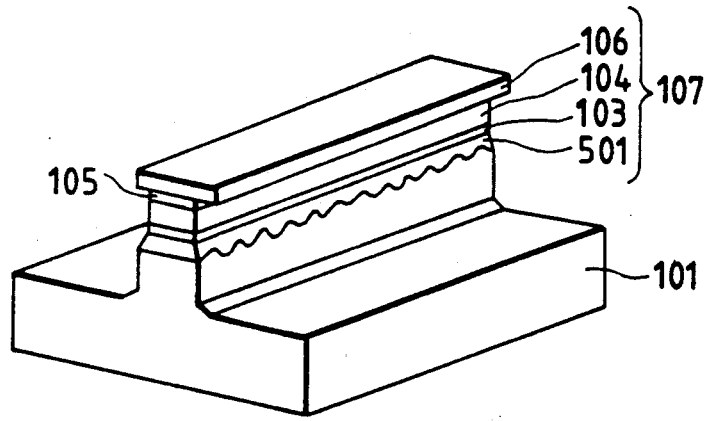
Figure 5D:
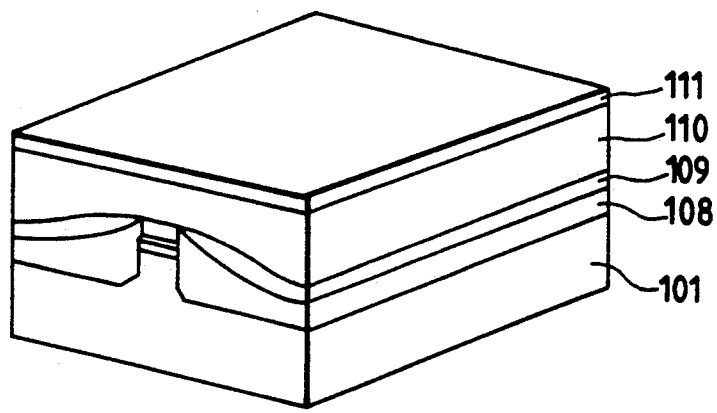

In FIG. 5A, on an n-InP substrate 101 having a (100) plane as a main plane, a diffraction grating is formed by a conventionally known method. More specifically, the substrate 101 is coated thereon with a photoresist in a thickness of about 1,000 Å to form a diffraction grating pattern by He-Cd laser (wavelength: 345 nm) beam interference photolithography. Thereafter, using a solution comprising a mixture of saturated bromine water, phosphoric acid and water, the resist on the substrate surface is selectively etched away in line with the diffraction grating pattern. As a result of the removal of the photoresist by the use of an organic solvent, a diffraction grating can be formed on the substrate. After the diffraction grating with periods of 2,000 Å has been formed, an n-InGaAsP wave guide layer 501 with a thickness of 0.2 μm, an InGaAsP active layer 103 with a thickness of 0.2 μm, a p-InP cladding layer 104 with a thickness of 0.3 μm and a p-InGaAsP surface protective layer 105 with a thickness of 0.2 μm are successively epitaxially grown to give a semiconductor laser wafer with a multi-layer structure. On the resulting semiconductor wafer, an insulating film 106 comprising $SiO_2$ or $Si_3N_4$ is deposited by photo CVD (or plasma CVD). Thereafter, an etching mask 106 is formed in a stripe with a width of 4 μm in parallel to the <011> direction by photolithography and dry etching. Then the procedure similar to that in the third embodiment follows. That is, using a solution comprising a mixture of hydrochloric acid, oxygenated water and acetic acid (volume ratio: 3:1:36), the n-InP substrate 101 is etched to a depth of about 1 μm beneath the InGaAsP active layer 103 to completely remove the InGaAsP active layer 103 except for its region corresponding to the mesa stripe. Then, using a solution comprising a mixture of hydrochloric acid and phosphoric acid (volume ratio: 1:2), the n-InP substrate 101 is further etched in substantially the vertical direction to a depth of about 2 μm to form the mesa stripe 107 (FIG. 5C). After the insulating film 106 has been removed using a hydrofluoric acid solution, the p-InP current blocking layer 108 and the n-InP current blocking layer 109 are formed on the regions other than the mesa stripe 107 by the liquid-phase epitaxial growth. Thereafter, the p-InP burying layer 110 and the p-InGaAsP contact layer 111 are successively grown. A buried heterostruoture is thus formed (FIG. 5D).

Figure 6:
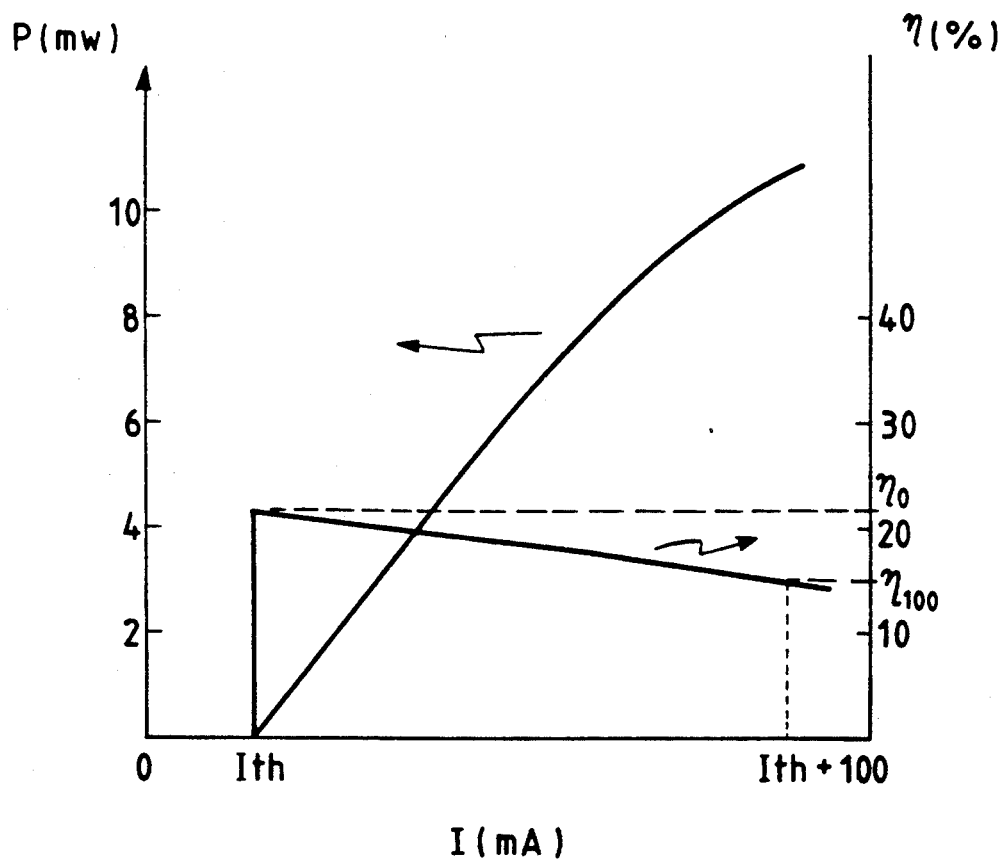
FIG. 6 shows light output characteristics of a semiconductor laser prepared by the method of the present invention.
Figure 7A:
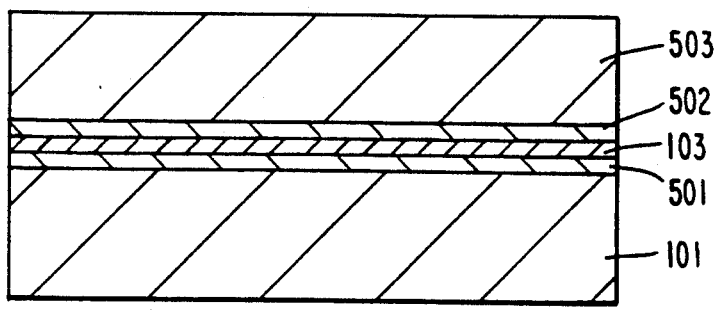
FIGS. 7A to 7E cross-sectionally illustrate a fabrication process for a conventional buried heterostructure.
Figure 7B:
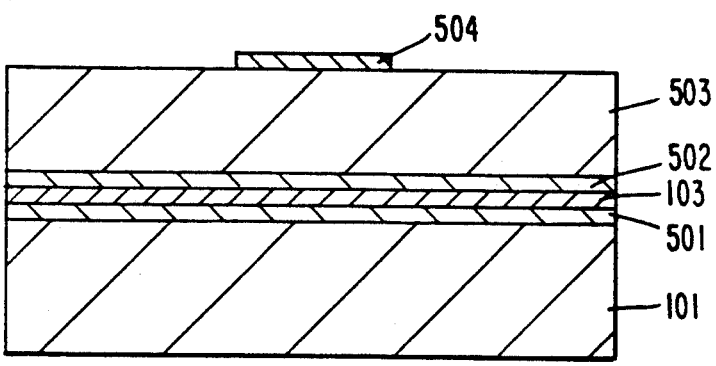
Figure 7C:
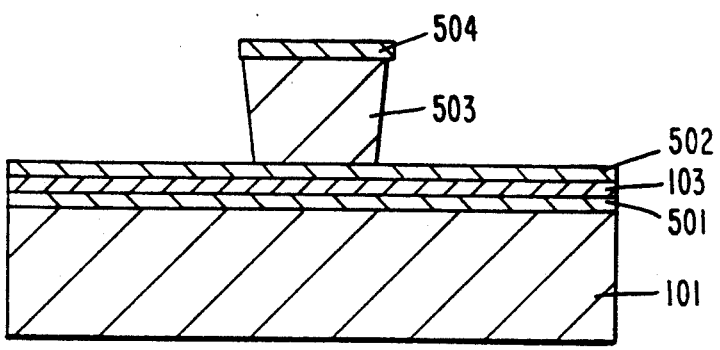
Figure 7D:
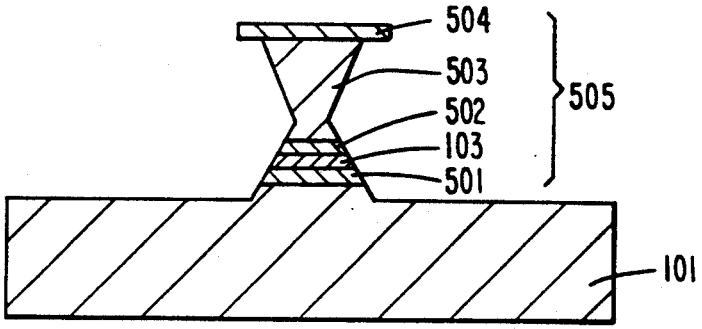
Figure 7E:
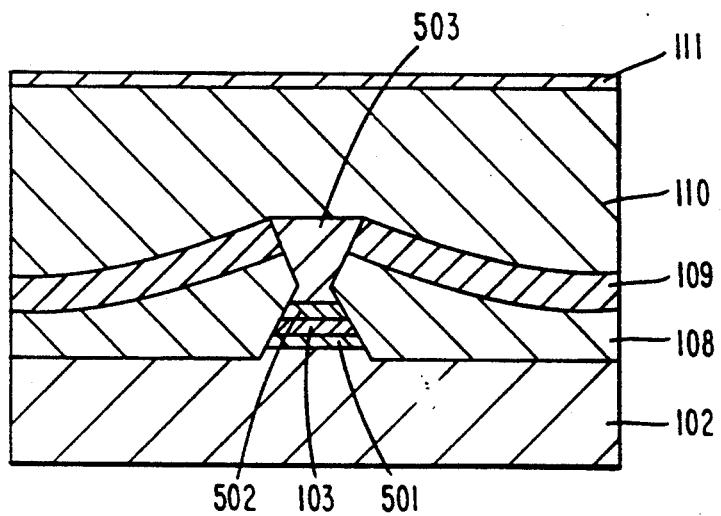
Figure 8:
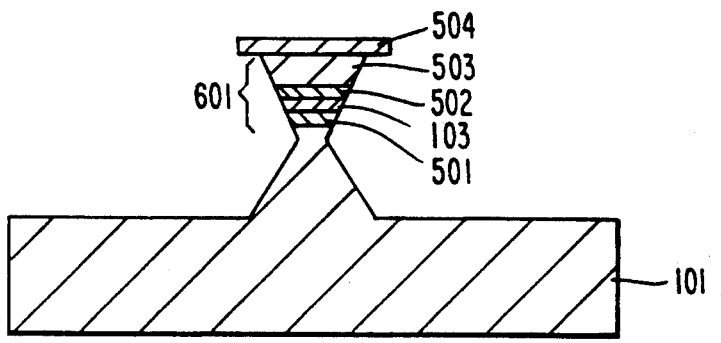
FIG. 8 cross-sectionally illustrates a step in the fabrication process for a conventional buried heterostructure.
Figure 9:
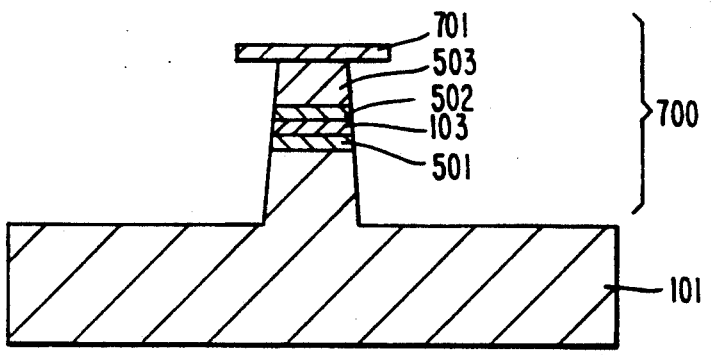
FIG. 9 also cross-sectionally illustrates a step in the fabrication process for a conventional buried heterostructure.

When, as shown in FIG. 6, the linearity in the output characteristics of the laser fabricated by the method of the present invention is expressed by the formula:

$(\eta_0 - \eta_{100})/\eta_0 \times 100$, wherein $\eta_0$ is an external differential quantum efficiency at a threshold value $I_{th}$ and $\eta_{100}$ is an external differential quantum efficiency at a threshold value $I_{th} + 100$ mA, the linearity was 11% while that in the laser fabricated by the conventional method was 17%. Thus, it was confirmed that the linearity has been greatly improved. This can promise an improvement in distortion characteristics in analogue transmission and in the instance where outputs are made higher.

In the embodiments described above, semiconductor wafers comprising the n-InP buffer layer provided thereon with the InGaAsP active layer in a laminate are used. The present invention can also be applied to a wafer comprising an n-InP substrate provided directly thereon with an InGaAsP active layer in laminae, or a wafer comprising an InGaAsP active layer provided thereon with an InGaAsP melt-back preventive layer in laminae.

In the present embodiments, the solution comprising a mixture of hydrochloric acid, oxygenated water and acetic acid is used as the etchant. The same effect can also be obtained when a weak acid such as phosphoric acid or pure water is used in place of acetic acid. In the present embodiments, in order to prevent dissociation of P atoms in the p-InP cladding layer that may occur when the epitaxial growth for burying is effected, the mesa stripe having the InGaAsP layer on its uppermost layer is formed by etching with the solution comprising a mixture of hydrochloric acid, oxygenated water and acetic acid. A similar mesa stripe may also be formed using other etchant such as a Br-methanol solution.

As the current blocking layers, the p-InP current blocking layer 108 and the n-InP current blocking layer 109 are used. Without limitation to such InP layers, InGaAsP layers with a larger energy gap than the active layer or semi-insulative InP layers may also be used.

As having been described above, the present invention has the following effects:

(1) On the semiconductor multi-structure wafer comprising a first-conductivity type InP substrate having a (100) plane as a main plane, provided thereon with at least an InGaAsP active layer, a second-conductivity type InP cladding layer and as an uppermost layer an InGaAsP surface protective layer, the insulating film mask is formed in a stripe in the <011> direction, and then these layers are etched with the solution comprising a mixture of hydrochloric acid and oxygenated water. This makes it easy to control the stripe width and to stably obtain the mesa stripe in the form of a regular mesa. Hence, the (111)A plane 601 is not exposed at the sides of the InGaAsP active layer even when the p-InP cladding layer has a small thickness, and good current blocking layers can be formed on both sides of the mesa stripe. It is therefore possible to obtain a laser with good characteristics.

(2) The epitaxial growth for burying is effected on the InP substrate comprising i) the mesa stripe having at least a first conductivity type InP layer, an InGaAsP active layer, a second-conductivity type InP cladding layer and as an uppermost layer an InGaAsP surface protective layer and ii) the region other than the mesa stripe, comprising the above first-conductivity type InP layer. Thus, the p-InGaAsP surface protective layer, the uppermost layer of the mesa stripe, can prevent defects from occurring in the p-InP cladding layer when it is soaked before the epitaxial growth for burying is effected, even when the p-InP cladding layer has a small thickness. Hence, laser characteristics can be prevented from becoming poor, e.g., the emission efficiency can be prevented from being lowered because of the occurrence of defects. It is therefore possible to obtain a laser with good characteristics.

What is claimed is:

1. A method of fabricating a semiconductor laser by a process comprising the steps of;

forming a mesa stripe having a first-conductivity type InP layer, an InGaAsP active layer, a second-conductivity type InP cladding layer and as an uppermost layer an InGaAsP surface protective layer;

forming on the first-conductivity type InP layer at its regions adjoining to said mesa stripe, a current blocking layer comprising a second-conductivity type InP layer and a current blocking layer comprising a first-conductivity type InP layer by liquid-phase epitaxial growth in this order, and at the same time melting back said p-InGaAsP surface protective layer of said mesa stripe to uncover said second-conductivity type InP cladding layer; and epitaxially growing a second-conductivity type InP layer and a second-conductivity type InGaAsP layer on the regions corresponding to said current blocking layers and said uncovered second-conductivity type InP cladding layer.

2. A method of fabricating a semiconductor laser according to claim 1, wherein a first-conductivity type buffer layer is formed between said substrate and said active layer.

3. A method of fabricating a semiconductor laser according to claim 1, wherein after the etching with the solution comprising a mixture of hydrochloric acid and oxygenated water, the InP layer beneath said InGaAsP active layer is etched with a solution comprising a mixture of hydrochloric acid and phosphoric acid.

4. A method of fabricating a semiconductor laser according to claim 1, wherein said current blocking layers are comprised of a second-conductivity type InP layer and a first-conductivity type InP layer, formed in this order from the substrate side.

5. A method of fabricating a semiconductor laser by a process comprising the steps of:

forming on a first-conductivity type InP substrate having a (100) plane as a main plane, a diffraction grating that defines oscillation wavelengths;

epitaxially growing a first-conductivity type InGaAsP wave guide layer, an InGaAsP active layer, a second-conductivity type InP cladding layer and a second-conductivity type InGaAsP surface protective layer successively on said diffraction grating;

forming on said surface protective layer an insulating film in a stripe as an etching mask;

etching said layers by the use of a solution comprising a mixture of hydrochloric acid and oxygenated water using said insulating film as a mask, and subsequently etching a semiconductor layer at its regions adjoining to both sides of said mask formed in a stripe by the use of a solution comprising a mixture of hydrochloric acid and phosphoric acid, to form a mesa stripe;

removing said insulating film (106); and forming current blocking layers on both sides of said mesa stripe by liquid-phase epitaxial growth and at the same time melting back said surface protective layer (105) of said mesa stripe to uncover said second-conductivity type cladding layer.

6. A method of fabricating a semiconductor laser according to claim 5, wherein said current blocking layers are comprised of a second-conductivity type InP layer and a first-conductivity type InP layer, formed in this order from the substrate side.

* * * * *